US012619132B2

(12) United States Patent
Watanabe et al.

(10) Patent No.: US 12,619,132 B2
(45) Date of Patent: May 5, 2026

(54) COOLING DEVICE AND ELECTRONIC APPARATUS SYSTEM

(71) Applicant: FUJIFILM Corporation, Tokyo (JP)

(72) Inventors: Yuta Watanabe, Saitama (JP);
Yoshihiro Hayashi, Saitama (JP);
Nobuaki Suzuki, Saitama (JP); Kouhei Awazu, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 291 days.

(21) Appl. No.: 18/464,258

(22) Filed: Sep. 10, 2023

(65) Prior Publication Data

US 2023/0418136 A1     Dec. 28, 2023

Related U.S. Application Data

(63) Continuation of application No. PCT/JP2022/003878, filed on Feb. 1, 2022.

(30) Foreign Application Priority Data

Mar. 25, 2021    (JP) ................................ 2021-051661

(51) Int. Cl.
*G03B 17/55* (2021.01)
*H04N 23/52* (2023.01)
(Continued)

(52) U.S. Cl.
CPC ............. *G03B 17/55* (2013.01); *H04N 23/52* (2023.01); *H04N 23/53* (2023.01); *H05K 7/20154* (2013.01); *H05K 7/2039* (2013.01)

(58) Field of Classification Search
CPC ........ G03B 17/55; G03B 17/56; H04N 23/52; H04N 23/53; H05K 7/20154; H05K 7/2039; G06F 1/16; G06F 1/20; H01L 23/467
See application file for complete search history.

(56) References Cited

U.S. PATENT DOCUMENTS 5,377,745 A * 1/1995 Hsieh .................... H01L 23/467
                                                    165/185
2006/0146500 A1* 7/2006 Yatskov ................ H01L 23/427
                                                    257/E23.099
(Continued)

FOREIGN PATENT DOCUMENTS

CN        210605624        5/2020
JP        S54-022417       2/1979
(Continued)

OTHER PUBLICATIONS

Michael Zhang, "Someone Made an Open-Source Body Cooler for Overheating Sony Cameras", Feb. 8, 2019, PetaPixel, retrieved from https://petapixel.com/2019/02/08/someone-made-an-open-source-body-cooler-for-overheating-sony-cameras/ on Sep. 3, 2025 (Year: 2019).*

(Continued)

*Primary Examiner* — Timothy J Henn
(74) *Attorney, Agent, or Firm* — JCIPRNET

(57)                ABSTRACT
There is provided a cooling device including: a heat sink on which a plurality of fins for heat radiation are formed; and an attachment mechanism for attachably and detachably attaching the heat sink to an outer surface of an electronic apparatus, at least a part of the attachment mechanism overlapping a formation region of the fins.

11 Claims, 15 Drawing Sheets

(51) Int. Cl.
  *H04N 23/53* (2023.01)
  *H05K 7/20* (2006.01)

(56) References Cited

U.S. PATENT DOCUMENTS

| | | | | |
|---|---|---|---|---|
| 2008/0156458 | A1* | 7/2008 | Li | H01L 23/4006 |
| | | | | 165/80.3 |
| 2010/0091461 | A1* | 4/2010 | Yamanaka | H01L 23/3675 |
| | | | | 361/709 |
| 2015/0049243 | A1* | 2/2015 | Samuels | G03B 17/55 |
| | | | | 348/374 |
| 2016/0262289 | A1* | 9/2016 | Yeh | F28F 13/06 |
| 2018/0007810 | A1* | 1/2018 | Sasaki | H05K 7/20154 |

FOREIGN PATENT DOCUMENTS

| | | |
|---|---|---|
| JP | 3108585 | 4/2005 |
| JP | 2007180706 | 7/2007 |
| JP | 2008277355 | 11/2008 |
| JP | 2012173591 | 9/2012 |
| JP | 2017169357 | 9/2017 |
| JP | 2020096145 | 6/2020 |

OTHER PUBLICATIONS

"International Search Report (Form PCT/ISA/210) of PCT/JP2022/003878", mailed on Apr. 19, 2022, with English translation thereof, pp. 1-7.

"Written Opinion of the International Searching Authority (Form PCT/ISA/237) of PCT/JP2022/003878", mailed on Apr. 19, 2022, with English translation thereof, pp. 1-10.

"Notice of Reasons for Refusal of Japan Counterpart Application", issued on Aug. 5, 2025, with English translation thereof, pp. 1-8.

"Decision of Refusal of Japan Counterpart Application", issued on Nov. 18, 2025, with English translation thereof, p. 1-p. 6.

* cited by examiner

SECOND EMBODIMENT, AND BELOW CENTER OF HEAT SINK

812B

35

83

100

H1

H2B

H2B < H1

811

35

83

812B

100

811

814

COOLING DEVICE AND ELECTRONIC APPARATUS SYSTEM

CROSS-REFERENCE TO RELATED APPLICATIONS

This application is a continuation application of International Application No. PCT/JP2022/003878 filed on Feb. 1, 2022, the disclosure of which is incorporated herein by reference in its entirety. Further, this application claims priority from Japanese Patent Application No. 2021-051661 filed on Mar. 25, 2021, the disclosure of which is incorporated herein by reference in its entirety.

BACKGROUND

1. Technical Field

The technology of the present disclosure relates to a cooling device and an electronic apparatus system.

2. Description of the Related Art

JP3108585Y discloses a projector comprising a light source lamp, a light tunnel for forming light emitted from the light source lamp into a rectangular shape, a projection lens for projecting a video, a light modulation element that reflects the light emitted from the light source lamp and supplies the reflected light to the projection lens, a fixing member for fixing the light modulation element, and an optical component holder for mounting the projection lens and the light modulation element. The optical component holder is made of aluminum (Al) and has an opening portion, and the light tunnel is attached to the optical component holder made of Al. The fixing member for fixing the light modulation element is inserted into the opening portion of the optical component holder. The optical component holder made of Al is integrally formed with a heat radiating member that is made of Al and has a plurality of heat radiating fins for cooling the light modulation element.

JP2017-169357A discloses a power conversion device comprising a substrate, a heat sink, a plurality of electronic components, and a fastening member. The heat sink has a plate-like base portion having a first surface and a second surface located on a back surface of the first surface, and a plurality of fin parts protruding from the first surface, and the substrate has a third surface located on the second surface, a fourth surface located on a back surface of the third surface, and through-holes provided from the third surface to the fourth surface. The plurality of electronic components are located on the fourth surface. The fastening member fixes the heat sink and the substrate. The fastening member is located and fixed inside the fin parts through the through-holes.

SUMMARY

One embodiment according to the technology of the present disclosure provides a cooling device and an electronic apparatus system capable of cooling an electronic apparatus at a necessary time and suppressing a decrease in cooling performance.

A cooling device according to the present disclosure comprises: a heat sink on which a plurality of fins for heat radiation are formed; and an attachment mechanism for attachably and detachably attaching the heat sink to an outer surface of an electronic apparatus, at least a part of the attachment mechanism overlapping a formation region of the fins.

It is preferable that the attachment mechanism includes an insertion hole provided in the formation region.

It is preferable that the insertion hole is provided between two fins adjacent to each other.

It is preferable that the insertion hole penetrates the fin.

It is preferable that the attachment mechanism includes an insertion portion to be inserted into the insertion hole, and an operation portion that is provided at one end of the insertion portion and is operated by a user in a case of attaching and detaching the heat sink.

It is preferable that the cooling device further comprises: a housing that covers the heat sink; and a falling-off prevention member that prevents the attachment mechanism from falling off from the housing, the insertion portion is disposed inside the housing, and the operation portion is disposed outside the housing, and the falling-off prevention member is provided at a boundary portion between the insertion portion and the operation portion.

It is preferable that the fins include a first fin and a second fin having a height lower than a height of the first fin, the second fin is at least any of a fin adjacent to the insertion hole or a fin overlapping the insertion hole, and the falling-off prevention member is provided between the housing and the second fin.

It is preferable that the cooling device further comprises: a fan that sends cooling air to the heat sink, a plurality of the attachment mechanisms are provided, and the plurality of attachment mechanisms are provided at positions where the fan is interposed therebetween.

It is preferable that the cooling device further comprises: a fan that sends cooling air to the heat sink and is attached to the formation region, the fins include a first fin and a third fin having a height lower than a height of the first fin, and the third fin overlaps the fan in a plan view.

It is preferable that the cooling device further comprises: an elastic sheet that is provided on an attachment surface of the heat sink to the outer surface and is used for adhering the heat sink to the outer surface.

It is preferable that the elastic sheet is not provided in a portion of the attachment mechanism.

It is preferable that the cooling device further comprises: a fan that sends cooling air to the heat sink; and a power receiving connector that is provided on the attachment surface of the heat sink to the outer surface and receives drive power of the fan from the electronic apparatus, and the elastic sheet is not provided in a portion of the power receiving connector.

It is preferable that the cooling device further comprises: a fan that sends cooling air to the heat sink; a power receiving connector that receives drive power of the fan from the electronic apparatus; a connector cover that covers the power receiving connector during non-use of the cooling device; and an accommodation portion that accommodates the connector cover removed from the power receiving connector during use of the cooling device.

It is preferable that the cooling device further comprises: a housing that covers the heat sink, and the accommodation portion is provided between the power receiving connector and the housing.

An electronic apparatus system according to the present disclosure comprises: an electronic apparatus; and the cooling device according to any one of the aspects.

It is preferable that the electronic apparatus is an imaging apparatus comprising a mobile monitor that is movable to at least a first position and a second position, and the outer surface is a surface that faces the mobile monitor in a case in which the mobile monitor is at the first position and is exposed in a case in which the mobile monitor is at the second position.

BRIEF DESCRIPTION OF THE DRAWINGS

Exemplary embodiments according to the technique of the present disclosure will be described in detail based on the following figures, wherein:

FIG. 1 is a diagram showing a digital camera;

DETAILED DESCRIPTION

Figure 2:
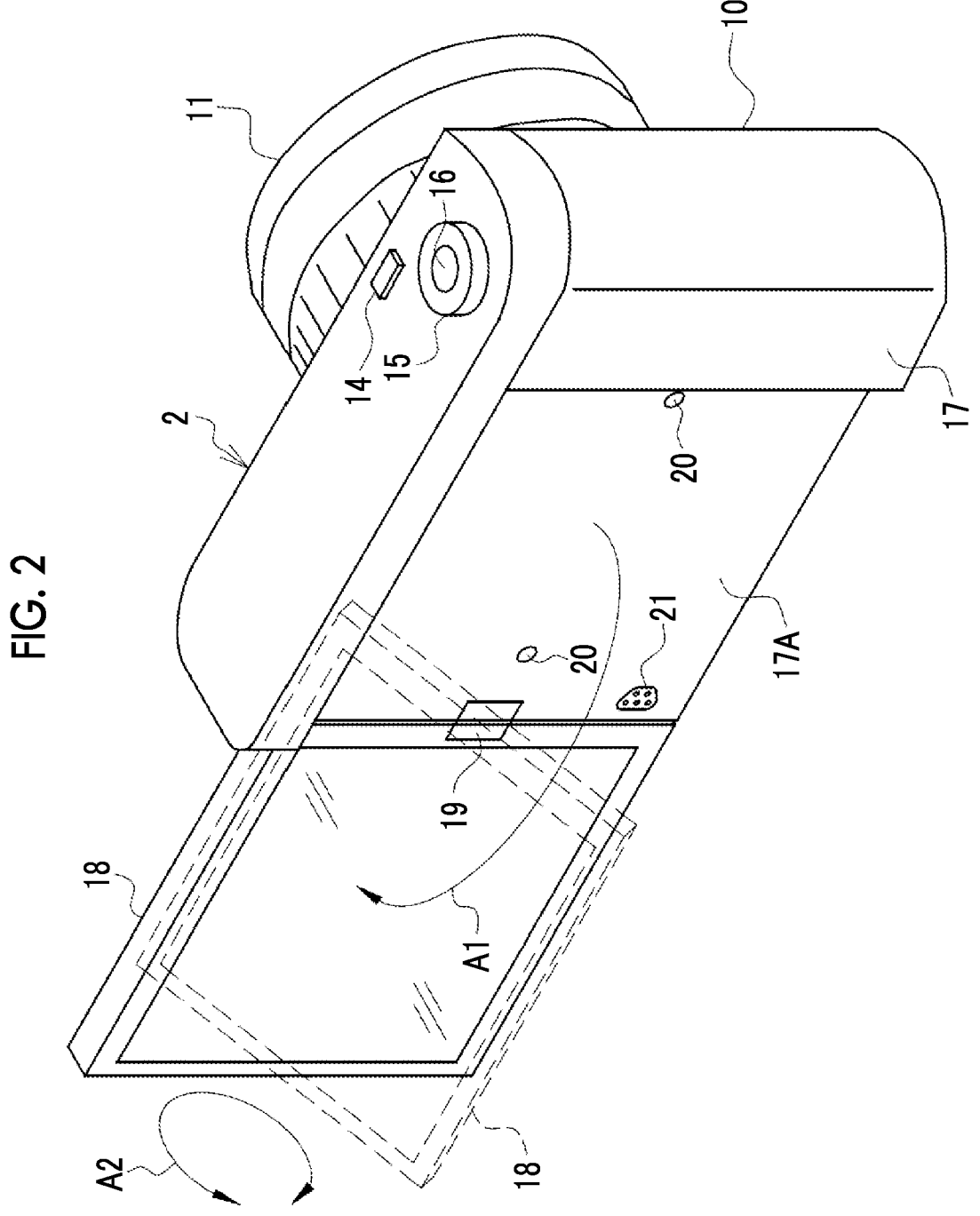
FIG. 2 is a diagram showing a state where a mobile monitor is moved from a position facing an attached surface.

Hereinafter, an example of embodiments of the technology of the present disclosure will be described with reference to the drawings.

First Embodiment

Figure 1:
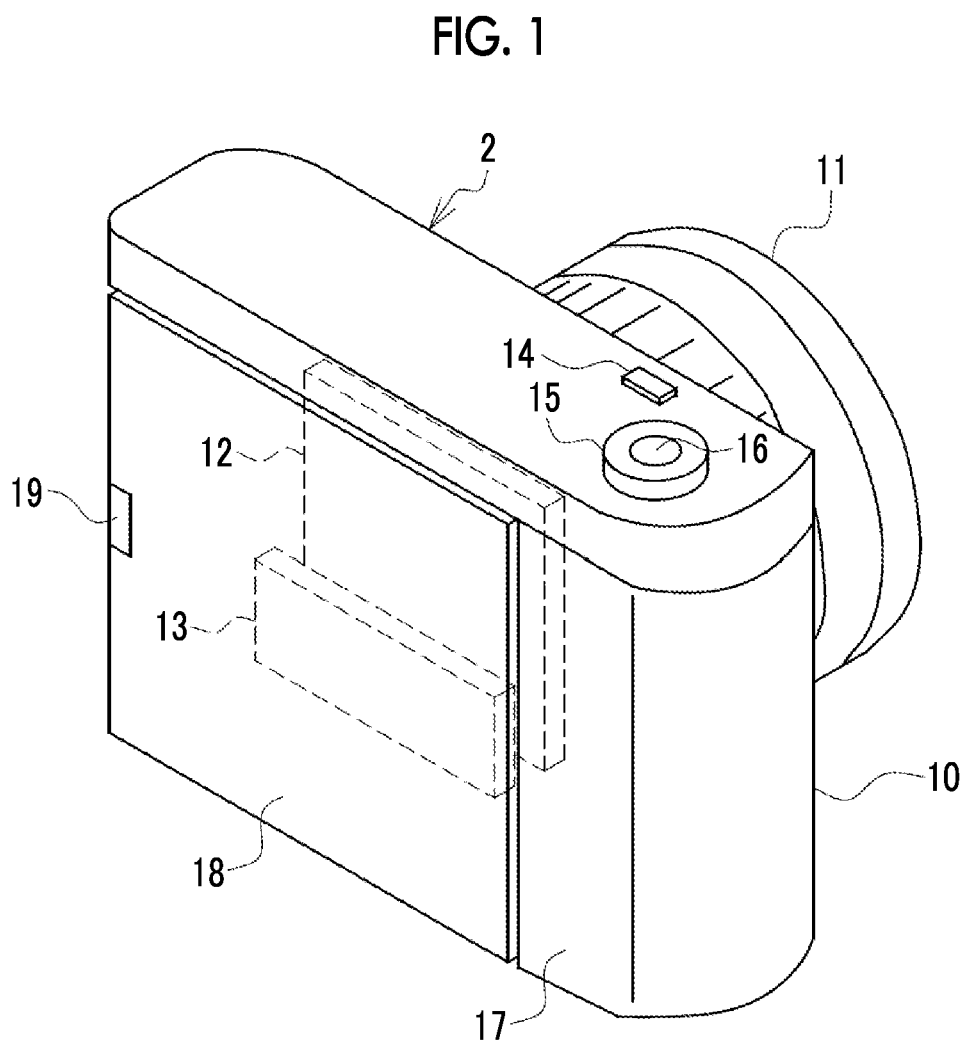

As shown in FIG. 1 as an example, a digital camera 2 comprises a camera body 10 and a lens barrel 11 provided on a front surface of the camera body 10. The lens barrel 11 has a lens group that guides subject light indicating a subject to an imaging element 12 in the camera body 10. The imaging element 12 is, for example, a complementary metal oxide semiconductor (CMOS) image sensor or a charge coupled device (CCD) image sensor. The imaging element 12 has a rectangular imaging surface that images the subject. The imaging surface receives the subject light. As is well known, on the imaging surface, pixels that perform photo-electric conversion of the received subject light and output electric signals are arranged in a two-dimensional manner. A central processing unit (CPU) 13 that controls an operation of the imaging element 12 is also incorporated in the camera body 10. An irradiation window of electronic flash light or the like is also provided on the front surface of the camera body 10. The digital camera 2 is an example of an "electronic apparatus" and an "imaging apparatus" according to the technology of the present disclosure.

A power switch 14, a mode dial 15, and a release button 16 disposed at the center of the mode dial 15 are provided on an upper surface of the camera body 10. The power switch 14 is operated in a case in which power of the digital camera 2 is turned on and off. The mode dial 15 is rotated in a case of switching between various operation modes of the digital camera 2, such as a still image capturing mode, a video image capturing mode, and an image playback mode. The release button 16 is pressed in a case of capturing an image. Although not shown, the camera body 10 is provided with an operation member, such as a menu button and a cross key, in addition to these.

A mobile monitor 18 is provided on a back surface 17 of the camera body 10. The mobile monitor 18 is attached to the back surface 17 via a hinge 19.

As shown in FIG. 2 as an example, the mobile monitor 18 can rotate by 180° in a left-right direction (left opening direction and right closing direction) indicated by an arrow A1 with the hinge 19 as a fulcrum. In addition, the mobile monitor 18 can rotate by 360° in an up-down direction indicated by an arrow A2. That is, the mobile monitor 18 is a vari-angle system monitor. In FIG. 2, the mobile monitor 18 opened to the left is shown by a solid line, and the mobile monitor 18 rotated upward in a state of being opened to the left is shown by a broken line. The position shown in FIG. 1 in which the mobile monitor 18 is closed to the right is an example of a "first position" according to the technology of the present disclosure. In addition, the position shown in FIG. 2 in which the mobile monitor 18 is opened to the left is an example of a "second position" according to the technology of the present disclosure.

A surface 17A (hereinafter, referred to as an attached surface) of the back surface 17 that faces the mobile monitor 18 in a case in which the mobile monitor 18 is at the position shown in FIG. 1 and is exposed in a case in which the mobile monitor 18 is at the position shown in FIG. 2 is provided with a pair of screw holes 20 for attachably and detachably attaching a cooling device 25 (see FIG. 3) described below. The screw holes 20 are disposed substantially at the center of the attached surface 17A in the up-down direction and are symmetrical with respect to the center of the attached surface 17A in the left-right direction. In addition, a power supply connector 21 for supplying power to the cooling device 25 is provided at a left end of the attached surface 17A. The attached surface 17A is an example of an "outer surface of an electronic apparatus" according to the technology of the present disclosure.

Figure 3:
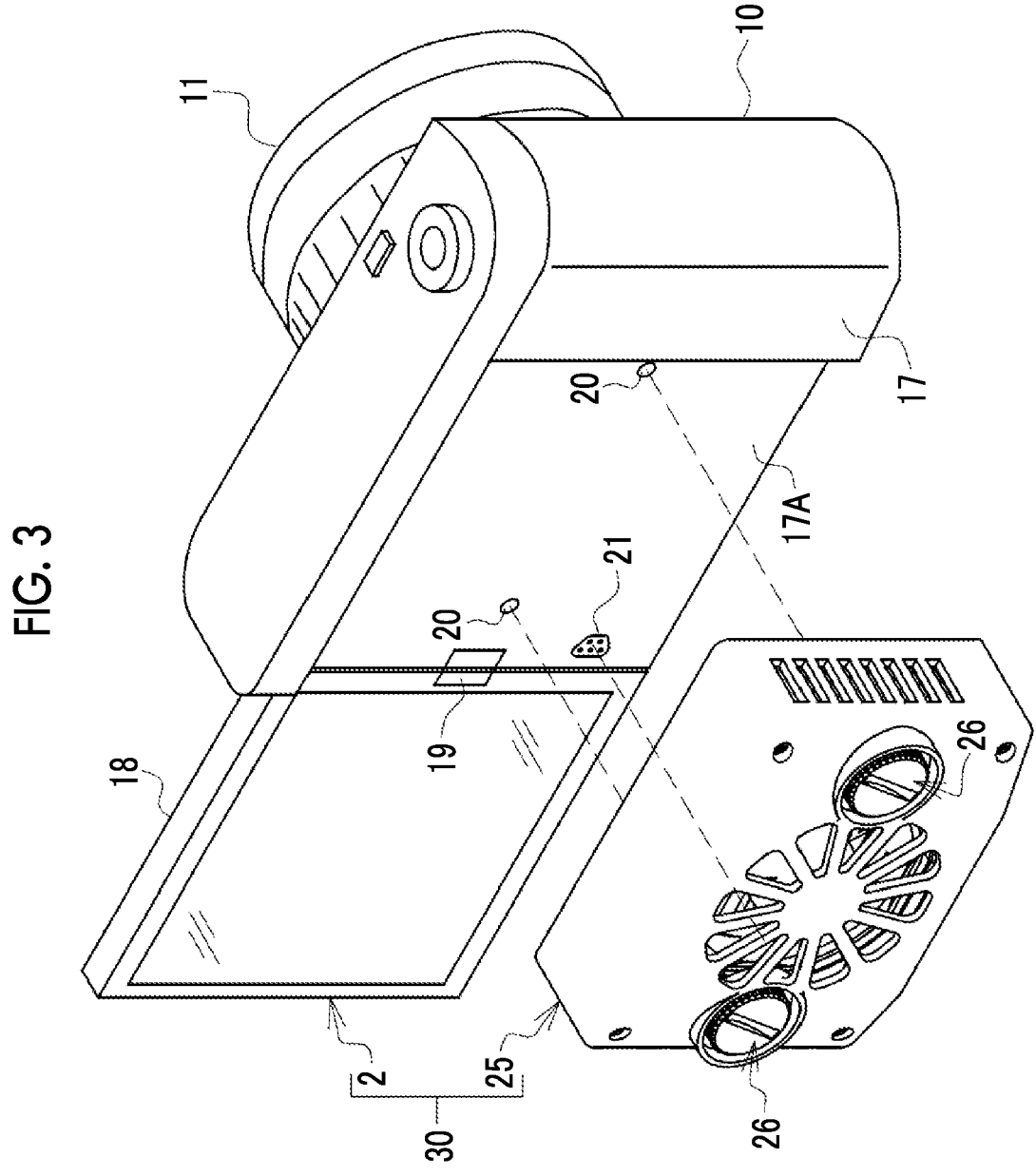
FIG. 3 is a diagram showing a digital camera system.

As shown in FIG. 3 as an example, in a case in which the mobile monitor 18 is moved from the back surface 17 and used, the cooling device 25 is attached to the attached surface 17A as necessary. The cooling device 25 has an attachment mechanism 26 that engages with the screw holes 20, and is attachably and detachably attached to the attached surface 17A. The cooling device 25 and the digital camera 2 constitute a digital camera system 30. The digital camera system 30 is an example of an "electronic apparatus system" according to the technology of the present disclosure.

Figure 4:
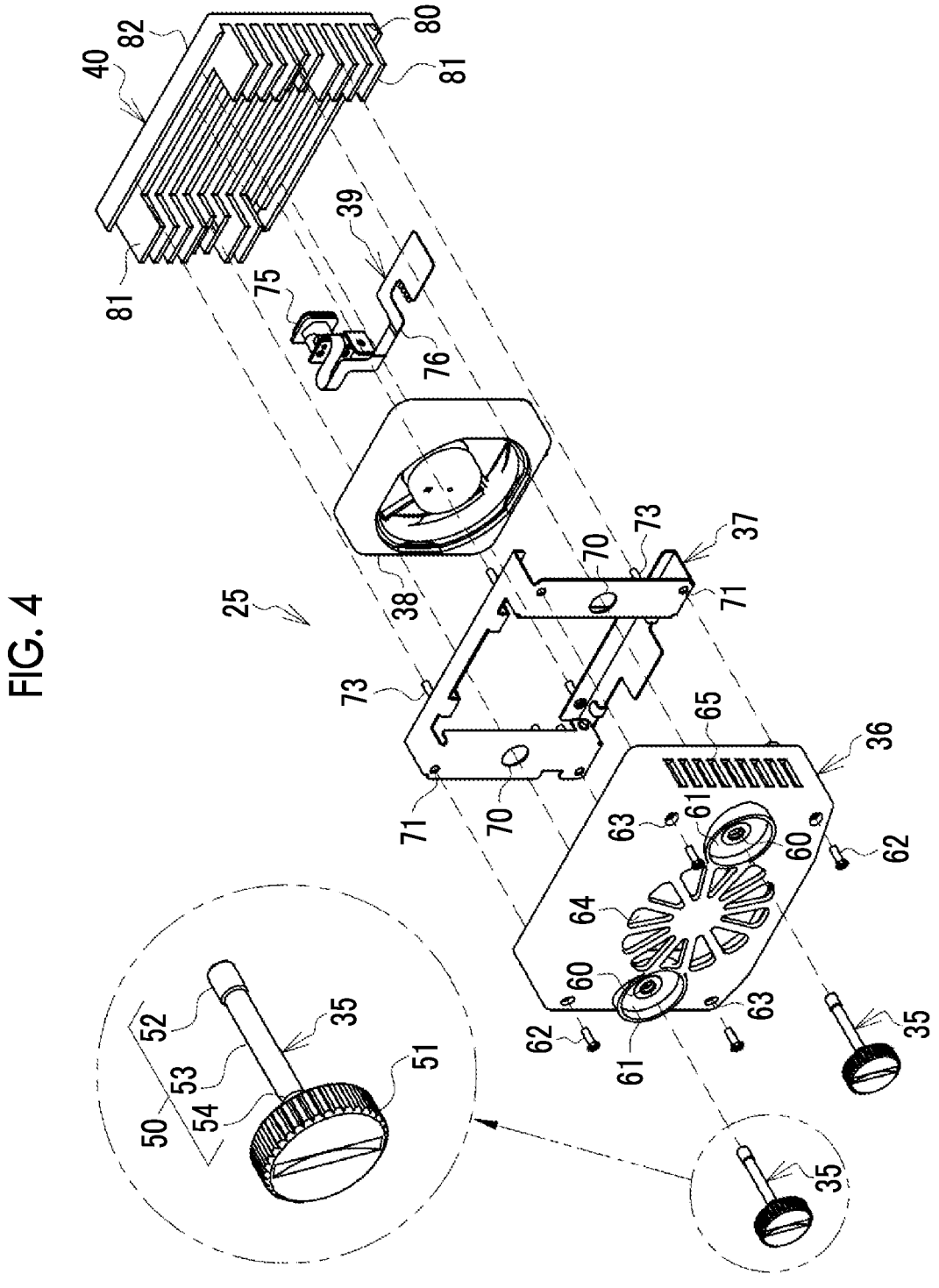
FIG. 4 is a front exploded perspective view of a cooling device.
Figure 5:
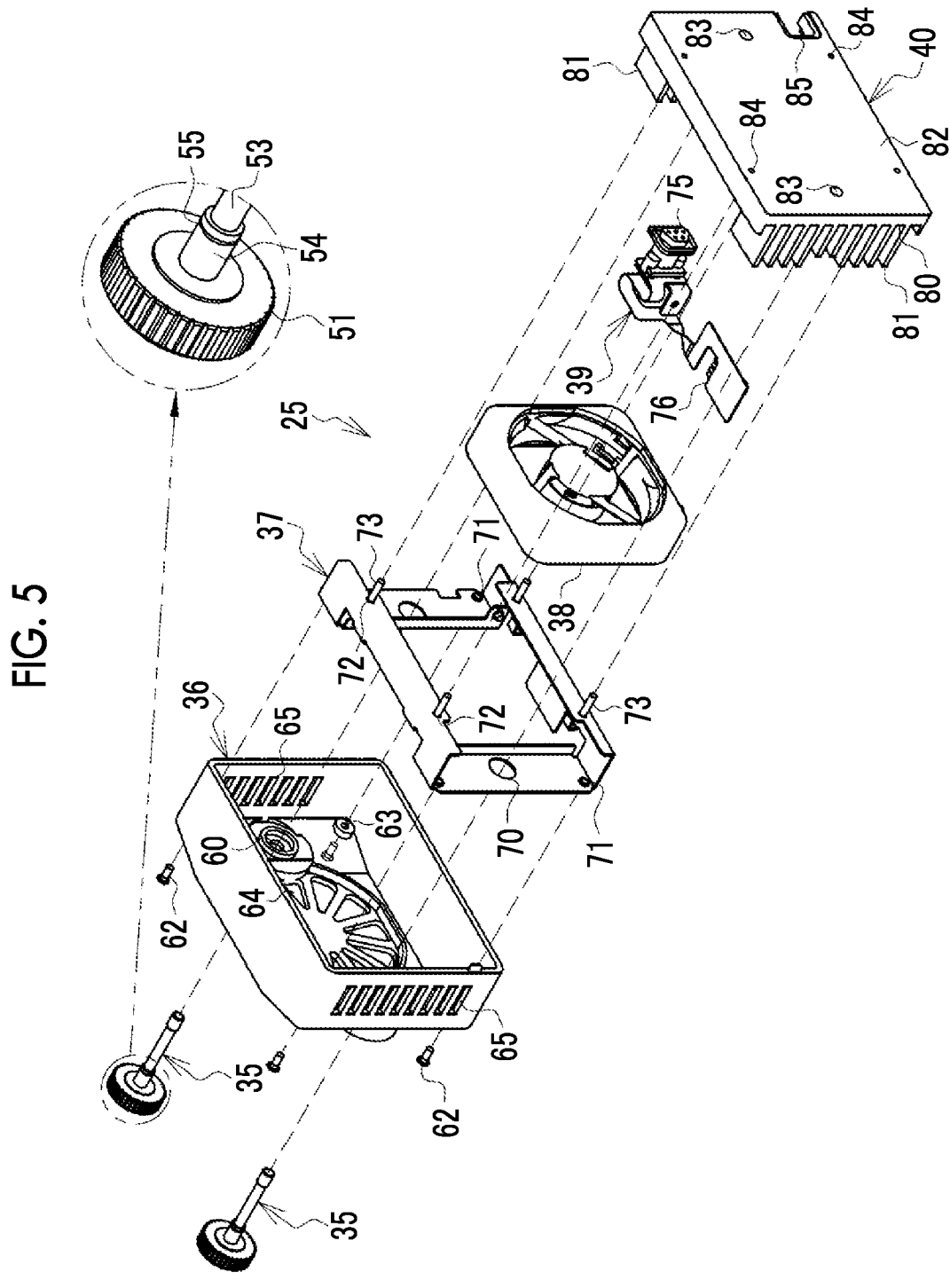
FIG. 5 is a back exploded perspective view of the cooling device.

As shown in FIGS. 4 and 5 as an example, the cooling device 25 comprises a pair of device attachment screws 35, a housing 36, a holding frame 37, a fan 38, a power receiving unit 39, and a heat sink 40. The housing 36 covers the holding frame 37, the fan 38, the power receiving unit 39, and the heat sink 40.

The device attachment screw 35 is included in the attachment mechanism 26. The device attachment screw 35 has an elongated cylindrical screw body portion 50 and a disk-shaped screw head portion 51 provided at one end of the screw body portion 50 and having a diameter larger than that of the screw body portion 50. The screw body portion 50 is made of metal, for example, stainless steel. The screw body portion 50 is configured of a screw portion 52 at a tip, a torso portion 53 in the middle, and a neck portion 54 at the root. The screw portion 52 is screwed into the screw hole 20 of the attached surface 17A. The torso portion 53 has a slightly smaller diameter than the screw portion 52 and the neck portion 54. The torso portion 53 is not threaded. A circumferential groove 55 is formed in the neck portion 54.

The screw head portion 51 is made of a resin having high hardness and high heat resistance, for example, a phenol resin. The screw head portion 51 is rotationally operated by a user in a case of attaching and detaching the cooling device 25. The screw head portion 51 has a size that is easy for the user to grasp with a finger, and a non-slip groove is formed on the entire peripheral surface of the screw head portion 51. In addition, a minus groove for inserting a rotation jig or the like is formed in the screw head portion 51. The screw body portion 50 is an example of an "insertion portion" according to the technology of the present disclosure. The screw head portion 51 is an example of an "operation portion" according to the embodiment of the technology of the present disclosure. In addition, the neck portion 54 is an example of a "boundary portion" according to the technology of the present disclosure.

A pair of insertion holes 60 into which the screw body portion 50 of the device attachment screw 35 is inserted is formed in the housing 36. A recess portion 61 in which the screw head portion 51 of the device attachment screw 35 is accommodated is formed around the insertion hole 60. In this way, the screw body portion 50 is disposed inside the housing 36, and the screw head portion 51 is disposed outside the housing 36 (see also FIG. 7).

Insertion holes 63 into which housing attachment screws 62 are inserted are formed at four corners of the housing 36. A plurality of fan-shaped intake ports 64 are radially formed in a central portion of a front surface of the housing 36. In addition, a plurality of slit-shaped intake ports 65 are formed on both side surfaces of the housing 36.

The holding frame 37 holds the fan 38 and the power receiving unit 39. A pair of insertion holes 70 into which the screw body portions 50 of the device attachment screws 35 are inserted is formed at positions of the holding frame 37 corresponding to the insertion holes 60. In addition, a screw hole 71 is formed at a position of the holding frame 37 corresponding to the insertion hole 63. The housing attachment screw 62 is screwed into the screw hole 71. As a result, the housing 36 and the holding frame 37 are integrated with each other. Further, four insertion holes 72 are formed at a position of the holding frame 37 one turn inside the screw hole 71. A holding frame attachment screw 73 is inserted into the insertion hole 72.

The fan 38 sends cooling air to the heat sink 40. More specifically, the fan 38 is an axial fan that sucks in air taken into the inside of the cooling device 25 from the intake ports 64 and and discharges the air toward the heat sink 40.

The power receiving unit 39 has a power receiving connector 75 and a flexible substrate 76. The power receiving connector 75 is connected to the power supply connector 21 of the attached surface 17A in a case in which the cooling device 25 is attached to the attached surface 17A. The power receiving connector 75 receives drive power of the fan 38 from the digital camera 2 via the power supply connector 21. One end of the flexible substrate 76 is connected to the power receiving connector 75, and the other end is connected to the fan 38. A drive circuit and power supply circuit for the fan 38 are mounted on the flexible substrate 76.

A plurality of fins 81 for heat radiation are formed on a front surface 80 of the heat sink facing the fan 38 as a whole. The fins 81 are erected in a front-rear direction, extend in the left-right direction, and are arranged in the up-down direction at substantially equal intervals. A back surface 82 of the heat sink 40 on a side opposite to the front surface 80 on which the fins 81 are formed comes into contact with the attached surface 17A in a case in which the cooling device 25 is attached. Since the fins 81 are formed on the entire surface of the front surface 80, here, the entire heat sink 40 is an example of a "formation region of fins" according to the technology of the present disclosure. The back surface 82 is an example of an "attachment surface" according to the technology of the present disclosure.

A pair of insertion holes 83 into which the screw body portions 50 of the device attachment screws 35 are inserted is formed at positions of the heat sink 40 corresponding to the insertion holes 60 and the insertion holes 70. The insertion hole 83 is included in the attachment mechanism 26. Since the insertion hole 83 is provided in the heat sink 40 which is an example of the "formation region of fins" according to the technology of the present disclosure, the attachment mechanism 26 overlaps the "formation region of fins". In addition, screw holes 84 are formed at positions of the heat sink 40 corresponding to the insertion holes 72. The holding frame attachment screw 73 is screwed into the screw hole 84. As a result, the holding frame 37, the heat sink 40, and the fan 38 are integrated with each other.

A U-shaped connector disposing portion 85 in a plan view is formed at a left end of the heat sink 40. The connector disposing portion 85 is provided by notching a part of the left end of the heat sink 40. The power receiving connector 75 is disposed in the connector disposing portion 85 (see FIG. 9).

Figure 6:
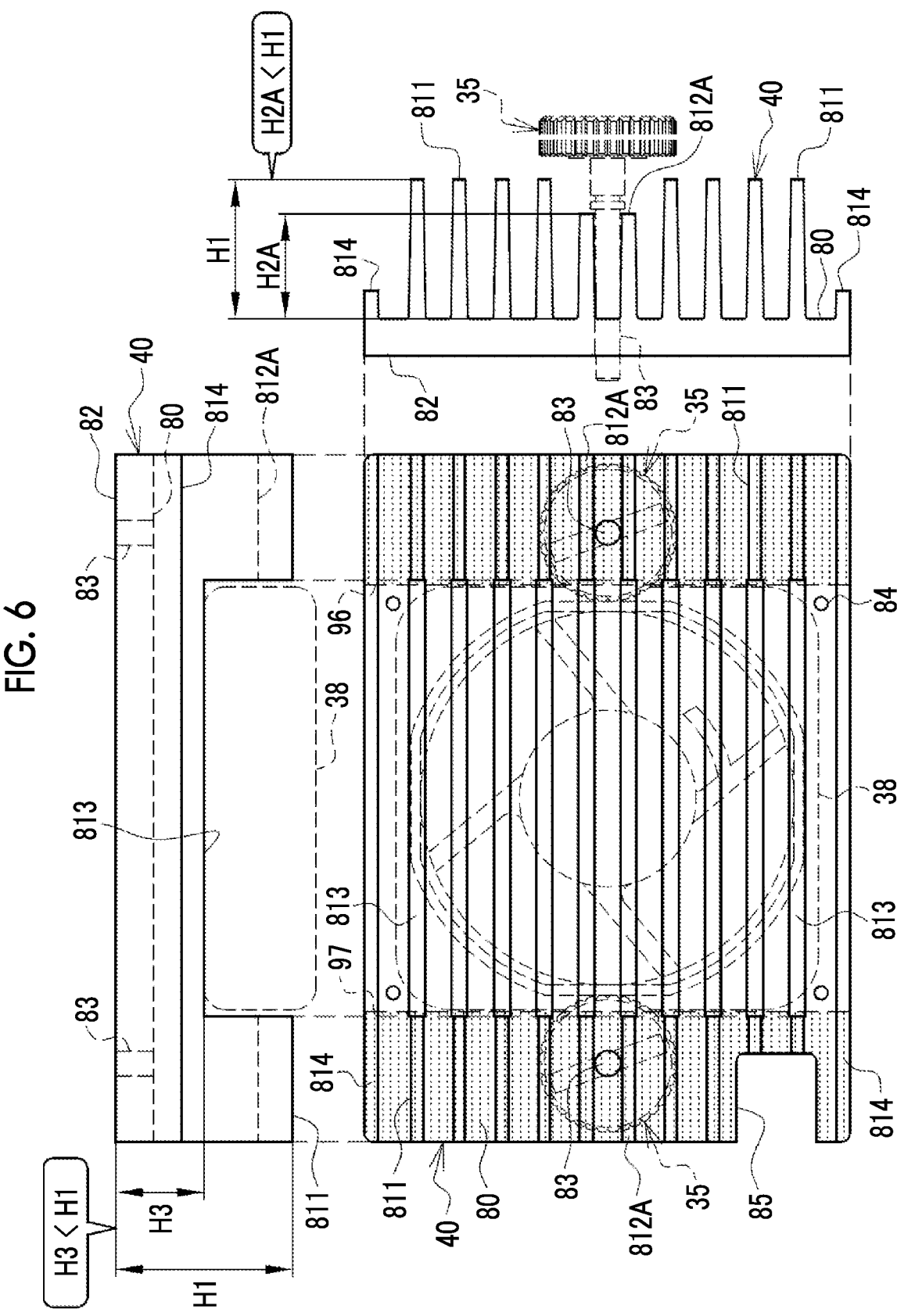
FIG. 6 is a three-view diagram of a heat sink.

As shown in FIG. 6 as an example, the device attachment screw 35 and the insertion hole 83 included in the attachment mechanism 26 are provided at positions facing each other on left and right sides with the fan 38 interposed therebetween. In addition, the fins 81 include fins 811 having a height H1, fins 812A having a height H2A, fins 813 having a height H3, and fins 814 formed at upper and lower ends. The insertion hole 83 is provided between two fins 812A adjacent to each other. The height H2A of the fin 812A is lower than the height H1 of the fin 811 (H2A<H1). The fin 811 is an example of a "first fin" according to the technology of the present disclosure. The fin 812A is an example of a "fin adjacent to the insertion hole" according to the technology of the present disclosure. In addition, the fin 812A is an example of a "second fin" according to the technology of the present disclosure.

In a plan view, the fins 813 overlap the fan 38. The height H3 of the fin 813 is lower than the height H1 of the fin 811

(H3<H1). The fin 813 is an example of a "third fin" according to the technology of the present disclosure.

Figure 7:
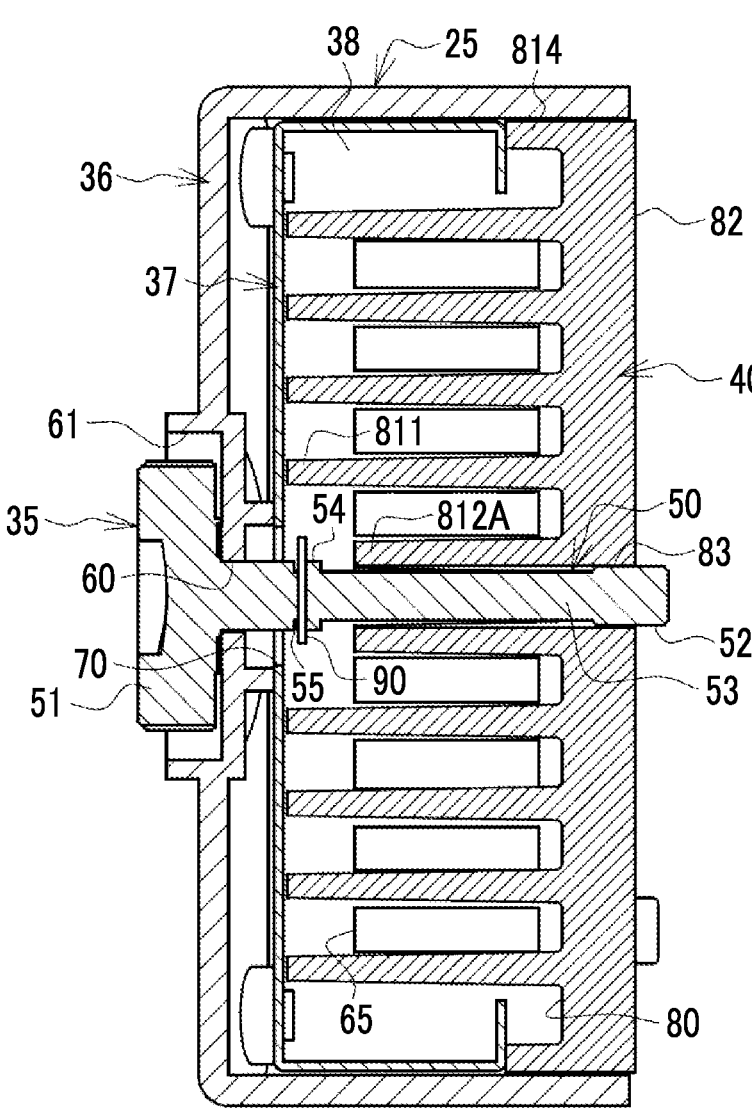
FIG. 7 is a cross-sectional view of the cooling device.
Figure 8:
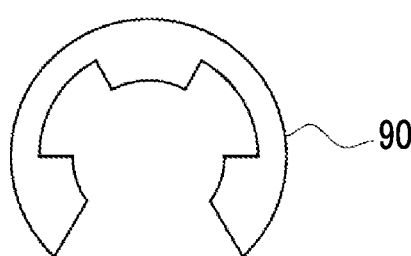
FIG. 8 is a diagram showing an E-type retaining ring.

As shown in FIG. 7 as an example, an E-type retaining ring (also referred to as an E-ring) 90 shown in FIG. 8 as an example is fitted into the groove 55 of the neck portion 54 of the device attachment screw 35. The neck portion 54 is located between the housing 36 and the fins 812A. Therefore, the E-type retaining ring 90 is provided between the housing 36 and the fins 812A. A diameter of the E-type retaining ring 90 is smaller than that of the insertion hole 70, but is larger than that of the insertion hole 60. Therefore, the device attachment screw 35 can move back and forth by the stroke of the insertion hole 60 and the insertion hole 70. In addition, the screw body portion 50 of the device attachment screw 35 is prevented from falling off from the insertion hole 60 and thus the housing 36 by the E-type retaining ring 90. That is, the E-type retaining ring 90 is an example of a "falling-off prevention member" according to the technology of the present disclosure. As the falling-off prevention member, a pin or the like that is inserted into a through hole formed in the neck portion 54 may be used.

Figure 9:
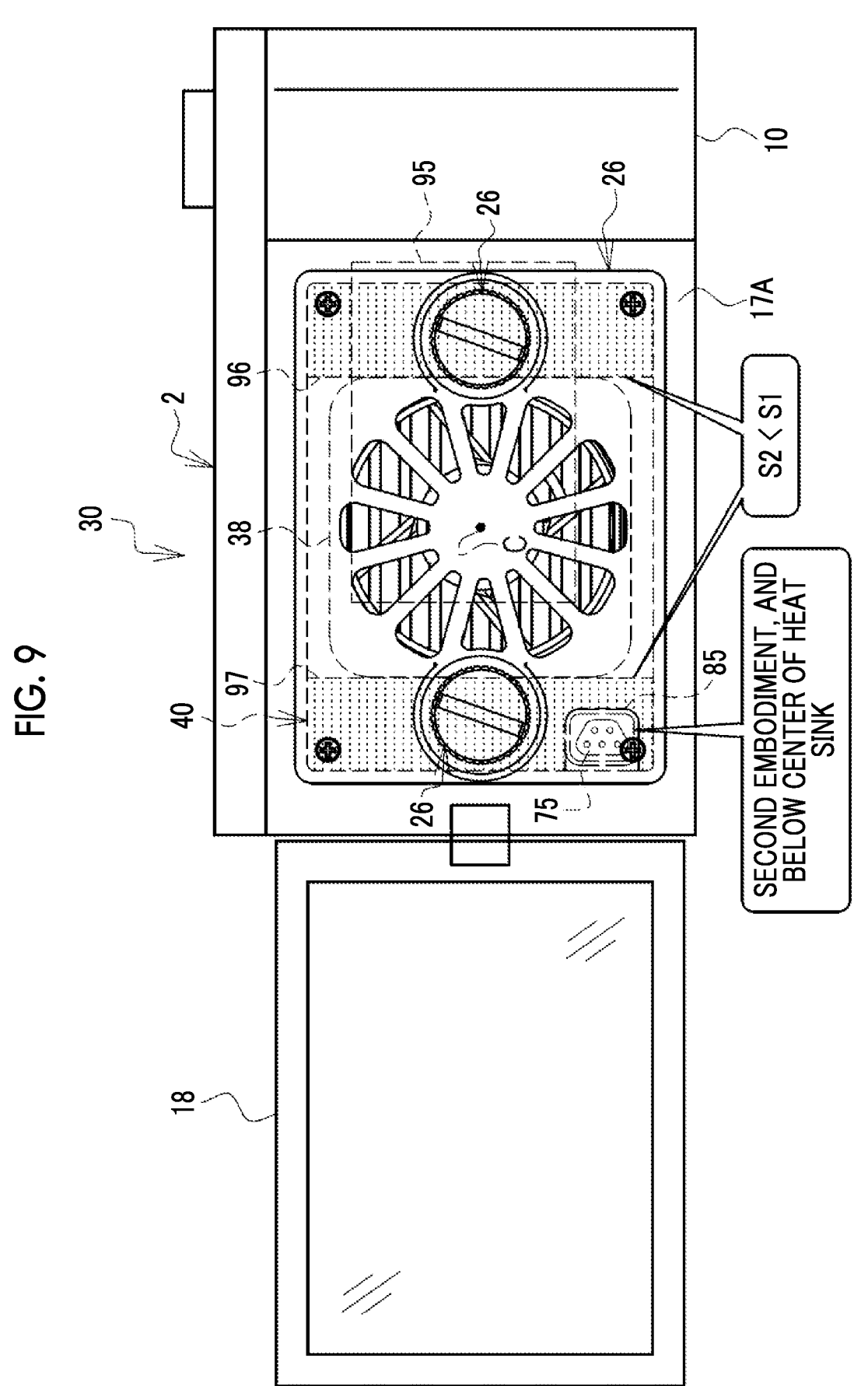
FIG. 9 is an explanatory diagram of a disposed position of a power receiving connector.

As shown in FIG. 9 as an example, a heat source 95 of the digital camera 2 is located substantially at the center of the camera body 10. The heat source 95 includes, for example, an imaging element 12, a drive circuit for the imaging element 12, a power supply circuit, and a CPU 13. With respect to this, the cooling device 25 is attached at a position shifted to the left from the center of the camera body 10. Therefore, in a case in which the digital camera 2 is viewed from the cooling device 25, the heat source 95 is shifted to the right.

In FIGS. 6 and 9, the heat sink 40 has a first formation region 96 of the fins 81 disposed on the right side with respect to the fan 38 and a second formation region 97 of the fins 81 disposed on the left side with respect to the fan 38. Most part of the heat source 95 is located in the first formation region 96 on the right side. In other words, the heat source 95 overlaps more the first formation region 96 than the second formation region 97. With respect to this, the connector disposing portion 85 of the heat sink 40 and thus the power receiving connector 75 are located in the second formation region 97 on the left side. An area S1 of the first formation region 96 is larger than an area S2 of the second formation region 97 because the connector disposing portion 85 is not provided (S2<S1). In addition, in FIG. 9, the connector disposing portion 85 and thus the power receiving connector 75 are disposed on the lower side with respect to the center C of the heat sink 40. The heat source 95 need only include at least any one of the imaging element 12 or the CPU 13. In addition, the cooling device 25 aims to efficiently cool the heat source 95 close to the back surface 17 inside the digital camera 2. Therefore, based on FIG. 1, the heat source 95 is preferably the CPU 13 close to the back surface 17 rather than the imaging element 12.

Next, an operation of the above configuration will be described. The user moves the mobile monitor 18 from the back surface 17 in a case of capturing an image or the like, and sets the mobile monitor 18 at a desired position and angle. The user attaches the cooling device 25 to the attached surface 17A in a case of, for example, performing video image capturing (for example, video image capturing at 120 frames per second with an image quality equivalent to a resolution of 4K (4K/120p)) by selecting a video image capturing mode with the mode dial 15, particularly in a case in which there is a concern about heat generation of the heat source 95. In this case, the user connects the power receiving connector 75 to the power supply connector 21 of the attached surface 17A, and screws the screw portion 52 of the device attachment screw 35 into the screw hole 20 of the attached surface 17A.

The back surface 82 of the heat sink 40 is in contact with the attached surface 17A. Therefore, the heat generated by the heat source 95 is transferred from the attached surface 17A to the heat sink 40, and is radiated by the fins 81 of the heat sink 40. In addition, drive power is supplied via the power receiving connector 75 to operate the fan 38. As a result, cooling air is sent from the fan 38 to the heat sink 40, and the heat transferred to the heat sink 40 is cooled.

As described above, the cooling device 25 comprises the heat sink 40 on which the plurality of fins 81 for heat radiation are formed, and the attachment mechanism 26 for attachably and detachably attaching the heat sink 40 to the attached surface 17A of the digital camera 2. As shown in FIG. 6, the insertion hole 83, which is a part of the attachment mechanism 26, overlaps the formation region of the fins 81. Therefore, the fin 81 is not sacrificed by the attachment mechanism 26. Therefore, it is possible to cool the digital camera 2 at a necessary time and to suppress a decrease in cooling performance.

As shown in FIGS. 4 and 5, the attachment mechanism 26 is provided in the formation region of the fins 81 and includes the insertion holes 83 into which the device attachment screws 35 are inserted. Therefore, the attachment mechanism 26 can have a simple structure.

As shown in FIG. 6, the insertion hole 83 is provided between the two fins 812A adjacent to each other. Therefore, the insertion hole 83 can be easily formed.

As shown in FIG. 4, the device attachment screw 35 has the screw body portion 50 that serves as the insertion portion to be inserted into the insertion hole 83, and the screw head portion 51 that is provided at one end of the screw body portion 50 and serves as the operation portion operated by the user in a case of attaching and detaching the heat sink 40 (cooling device 25). Therefore, the heat sink 40 (cooling device 25) can be easily attached or detached.

The cooling device 25 comprises the housing 36 that covers the heat sink 40. In addition, as shown in FIG. 7, the screw head portion 51 is disposed outside the housing 36, and the screw body portion 50 is disposed inside the housing 36. Further, the E-type retaining ring 90 as the falling-off prevention member that prevents the device attachment screw 35 from falling off from the housing 36 is attached to the neck portion 54 which is a boundary portion between the screw body portion 50 and the screw head portion 51. Therefore, it is possible to prevent the device attachment screw 35 from falling off from the housing 36. Although the housing 36 covers not only the heat sink 40 but also the holding frame 37, the fan 38, and the power receiving unit 39, the housing 36 still covers the heat sink 40.

As shown in FIG. 6, the fins 81 include the fins 811 as the first fin, and the fins 812A as the second fin having a height lower than that of the fin 811. The fin 812A is a fin adjacent to the insertion hole 83. Therefore, a space can be secured on a side of the front surface 80 of the fin 812A. In this example, the neck portion 54 is disposed in this space. Therefore, it is possible to fit the E-type retaining ring 90 into the groove 55 of the neck portion 54 to prevent the device attachment screw 35 from coming off.

The device attachment screw 35 has the screw body portion 50 made of metal. Therefore, as with the fin 81 of the heat sink 40, the screw body portion 50 can act as the heat radiating member. On the other hand, the device attachment screw 35 has the screw head portion 51 made of a resin having high heat resistance. Therefore, the heat from the screw body portion 50 is not transferred to the screw head portion 51. Therefore, it is possible to protect the finger of the user who grips the screw head portion 51 from heat.

The cooling device 25 comprises the fan 38 that sends cooling air to the heat sink 40. As shown in FIG. 6, a pair of the attachment mechanisms 26 is provided at positions where the fan 38 is interposed therebetween. Therefore, a sense of stability in a case in which the cooling device 25 is attached to the attached surface 17A is increased. It is possible to suppress rattling of the cooling device 25 due to vibration of the fan 38.

As shown in FIG. 6, the fan 38 is attached to the formation region of the fins 81. The fins 81 include the fins 811 as the first fin, and the fins 813 as the third fin having a height lower than that of the fin 811. In a plan view, the fins 813 overlap the fan 38. Therefore, a space for the fan 38 can be secured on a side of the front surface 80 of the fin 813. This can contribute to making the cooling device 25 compact.

As shown in FIG. 3, the digital camera system 30 includes the digital camera 2 comprising the mobile monitor 18, and the cooling device 25 that cools the heat generated in the digital camera 2. Recently, the digital camera 2 has a problem of heat generation, particularly in a case of performing video image capturing. Therefore, the cooling device 25 can efficiently cool the heat generated in the digital camera 2 at a necessary time, such as in a case of performing video image capturing.

The digital camera 2 comprises the mobile monitor 18 and the screw holes 20 in the attached surface 17A. The cooling device 25 comprises the attachment mechanism 26 for attachably and detachably attaching the heat sink 40 to the digital camera 2. The attachment mechanism 26 is attached to the screw holes 20 exposed by moving the mobile monitor from a position facing the attached surface 17A. The attached surface 17A is usually covered with the mobile monitor 18. Therefore, the screw holes 20 are also usually hidden by the mobile monitor 18. Therefore, the appearance is better than that of a digital camera in a state where the screw holes 20 are always exposed. In addition, since the chance of foreign matter such as dust entering the screw hole 20 is reduced, there is less risk of failure and better maintenance than those of a digital camera in a state where the screw holes 20 are always exposed.

The digital camera 2 includes the screw holes 20, and the attachment mechanism 26 of the cooling device 25 includes the screw portion 52 that is fitted into the screw hole 20. Therefore, the cooling device 25 can be attached to and detached from the digital camera 2 with a simple structure.

As shown in FIG. 2, the mobile monitor 18 is a vari-angle system monitor. Therefore, compared to a tilt system in which the mobile monitor is pulled out backward from the back surface and rotated in the up-down direction, the attached surface 17A has a larger area, and a contact surface with the heat sink 40 of the cooling device 25 can be widely secured correspondingly. Therefore, the cooling efficiency can be further increased.

As shown in FIG. 5, the heat sink 40 has the connector disposing portion 85. The power receiving connector 75 that receives drive power of the fan 38 from the digital camera 2 is disposed in the connector disposing portion 85. As shown in FIG. 9, the heat source 95 of the digital camera 2 is on the right side of the first formation region 96, and the power receiving connector 75 is on the left side of the second formation region 97. The area S1 of the first formation region 96 is larger than the area S2 of the second formation region 97. In addition, the power receiving connector 75 is disposed on the lower side with respect to the center C of the heat sink 40.

Since the portion where the connector disposing portion 85 is formed does not have the fin 81, the cooling performance is deteriorated. Therefore, in a case in which the connector disposing portion 85 is formed in the first formation region 96 in the same way as the heat source 95 that requires cooling, there is a concern that the cooling efficiency is lowered. However, in this example, since the power receiving connector 75 is disposed by forming the connector disposing portion 85 in the second formation region 97 on the side opposite to the first formation region 96, there is little concern that the cooling efficiency is lowered.

In addition, heat is relatively likely to be accumulated in an upper part of the heat sink 40. Therefore, there is a concern that the cooling efficiency is lowered even in a case in which the connector disposing portion 85 is formed on the upper side with respect to the center of the heat sink 40. However, in this example, since the power receiving connector 75 is disposed by forming the connector disposing portion 85 on the lower side with respect to the center C of the heat sink 40, there is little concern that the cooling efficiency is lowered.

The electronic apparatus is the digital camera 2 having the imaging element 12 that captures a video image, and the heat source 95 is the imaging element 12 and the CPU 13 that executes processing of the video image. Therefore, the cooling device 25 can efficiently cool the heat source 95, particularly in a case of performing video image capturing in which heat generation of the heat source 95 is a concern.

In the following description, the same members and parts as those described in the first embodiment will be denoted by the same reference numerals as those in the first embodiment, and the description thereof will be omitted.

Second Embodiment

In the first embodiment described above, the insertion hole 83 is provided between the two fins 812A adjacent to each other, but the present invention is not limited to this. As shown in a heat sink 100 shown in FIGS. 10 and 11 as an example, the insertion hole 83 may be provided to penetrate a fin 812B. The fin 812B is an example of a "fin overlapping the insertion hole" according to the technology of the present disclosure.

Figures 10, 11:
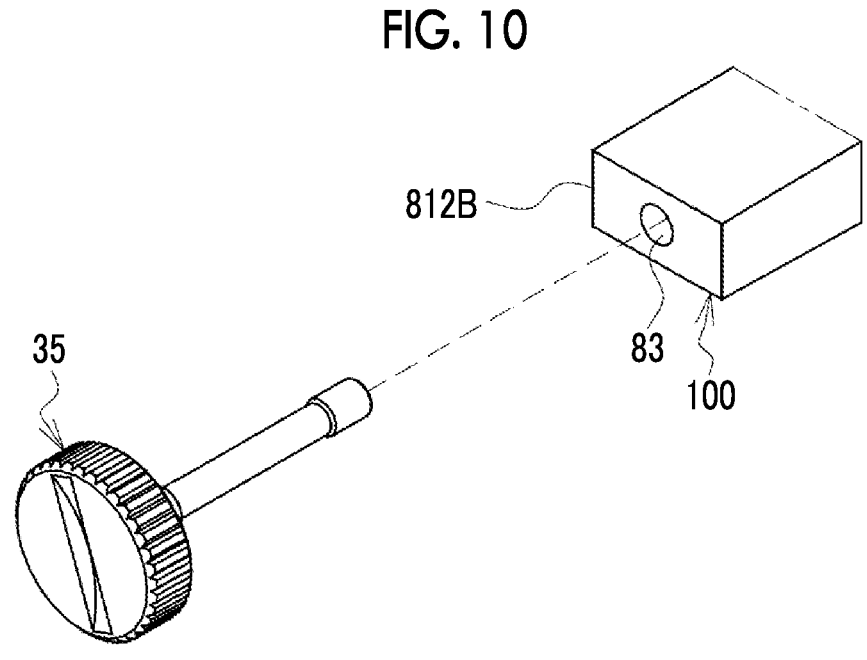
FIG. 10 is a diagram showing a second embodiment in which an insertion hole is provided to penetrate a fin.
FIG. 11 is a diagram showing a second embodiment in which an insertion hole is provided to penetrate a fin.

As shown in FIG. 11, a height H2B of the fin 812B is lower than the height H1 of the fin 811 (H2B<H1). The fin 812B is an example of a "second fin" according to the technology of the present disclosure, as with the fin 812A of the first embodiment.

As described above, in a second embodiment, the insertion hole 83 penetrates the fin 812B. Therefore, the screw body portion 50 of the device attachment screw 35 is not disposed between the fins 81. Therefore, it is possible to improve an air passage compared to the first embodiment in which an air passage between the fins 812A is impaired by the screw body portion 50.

In the fin 812B, a width of the portion where the insertion hole 83 is formed in the up-down direction may be wider than that of the other portions.

Third Embodiment

Figure 12:
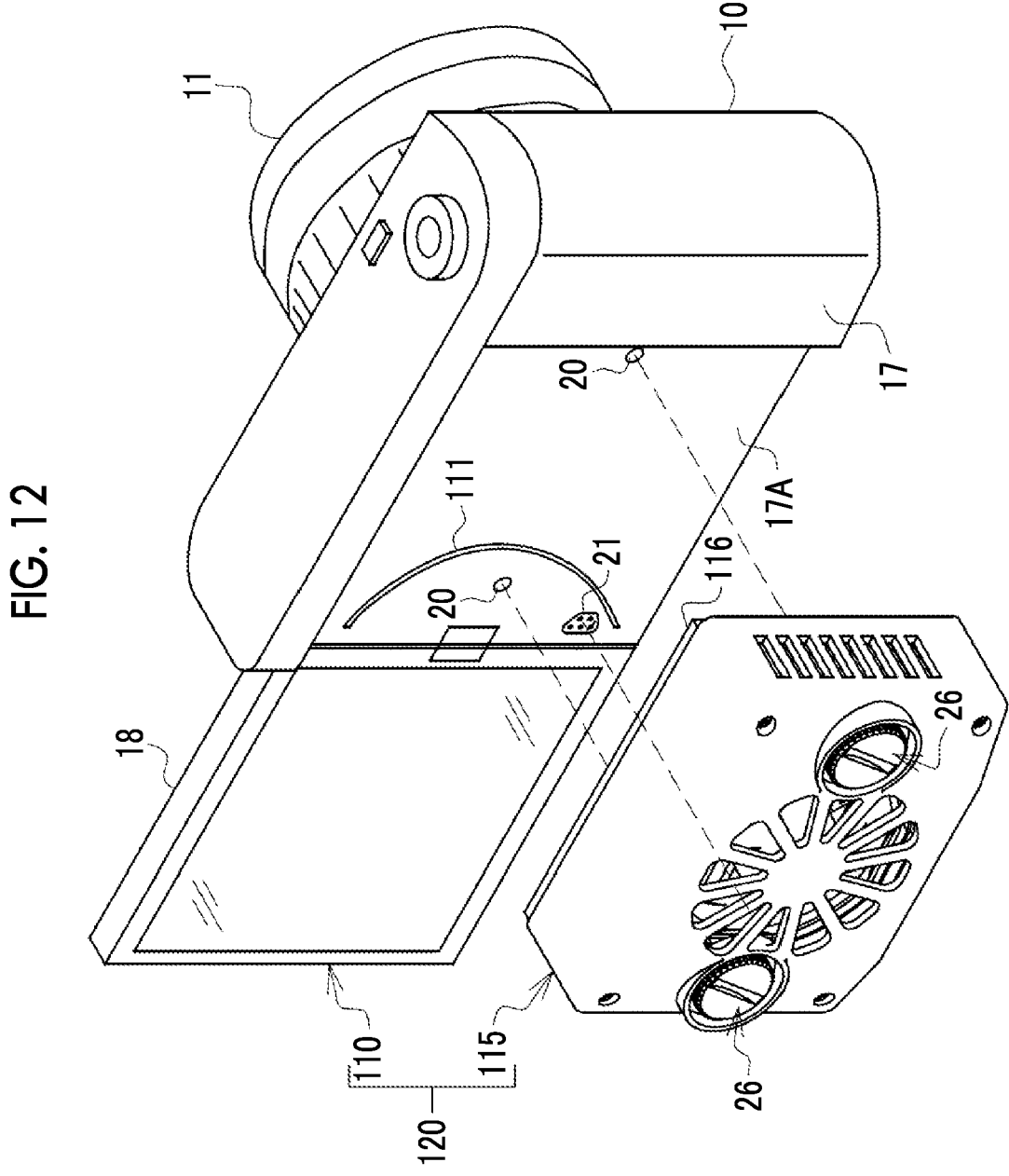
FIG. 12 is a diagram showing a digital camera system configured of a digital camera having a groove formed on an attached surface and a cooling device according to a third embodiment.

As shown in FIG. 12 as an example, in a digital camera 110, a recess portion 111 is formed in the attached surface 17A. The recess portion 111 is a step for preventing a corner portion of the mobile monitor 18 from coming into contact with the attached surface 17A in a case in which the mobile monitor 18 is rotated in the up-down direction at a halfway opening angle in the left-right direction.

A cooling device 115 constitutes a digital camera system 120 together with the digital camera 110. Although the basic configuration of the cooling device 115 is the same as that of the cooling device 25 of the first embodiment, the cooling device 115 is different from the cooling device 25 in that an elastic sheet 116 for adhering the heat sink 40 to the recess portion 111 of the attached surface 17A is attached to the cooling device 115. As the name implies, the elastic sheet 116 has elasticity and relatively high thermal conductivity. The elastic sheet 116 is, for example, a graphite sheet.

Figure 13:
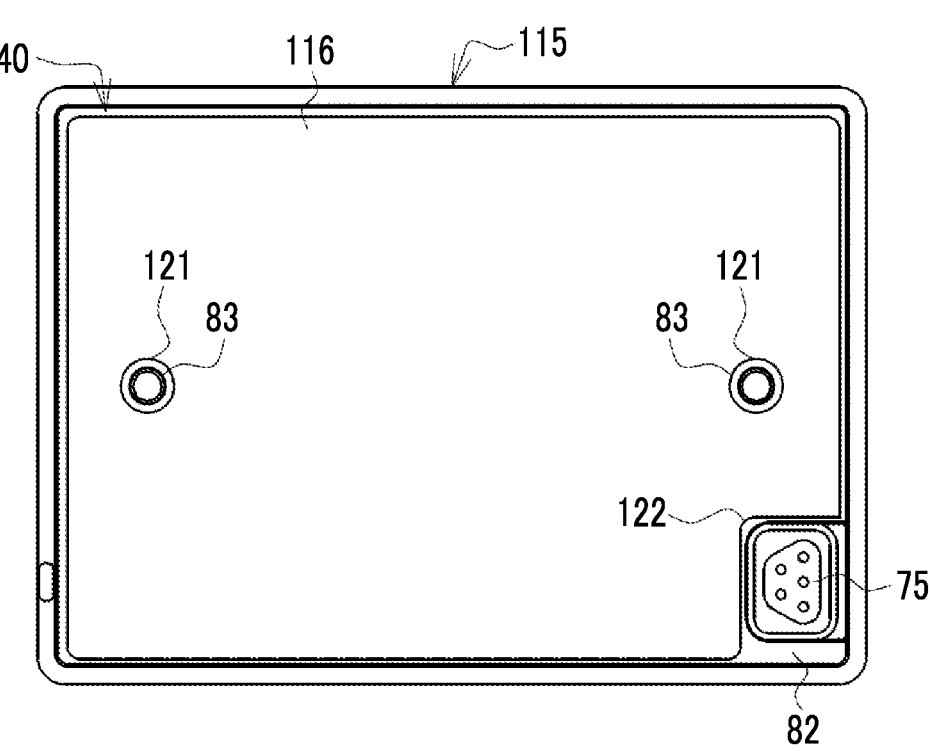
FIG. 13 is a diagram showing the cooling device according to the third embodiment which comprises an elastic sheet.

As shown in FIG. 13 as an example, the elastic sheet 116 is attached to the back surface 82 of the heat sink 40 which comes into contact with the attached surface 17A. The elastic sheet 116 substantially covers the back surface 82, but slightly exposes a part thereof. That is, the elastic sheet 116 has a hole 121 bored in a circular shape to fit the insertion hole 83, and a corner portion 122 cut out in a rectangular shape to fit the power receiving connector 75. Since the insertion hole 83 is included in the attachment mechanism 26, the elastic sheet 116 is not provided in the portion of the attachment mechanism 26 by the hole 121. In addition, the elastic sheet 116 is not provided in the portion of the power receiving connector 75 because of the corner portion 122.

As described above, the cooling device 115 according to a third embodiment comprises the elastic sheet 116 that is provided on the back surface 82 of the heat sink 40, which is an attachment surface to the attached surface 17A, and that is used for adhering the heat sink 40 to the attached surface 17A. The elastic sheet 116 is adhered to the recess portion 111 of the attached surface 17A. Therefore, even in a case in which the attached surface 17A has a step such as the recess portion 111, the adhesiveness of the heat sink 40 to the attached surface 17A can be improved, and more heat can be transferred from the attached surface 17A to the heat sink 40.

The elastic sheet 116 is not provided in the portion of the attachment mechanism 26. Therefore, the elastic sheet 116 does not hinder the attachment of the cooling device 115 to the attached surface 17A. In addition, the elastic sheet 116 is not provided in the portion of the power receiving connector 75. Therefore, the elastic sheet 116 does not hinder the power supply to the fan 38.

Figure 14:
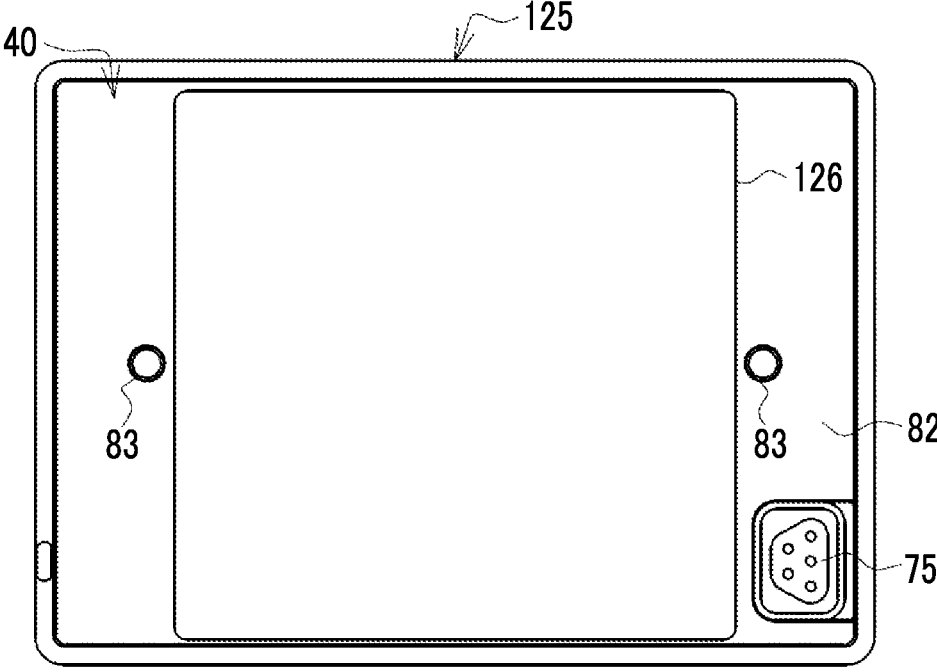
FIG. 14 is a diagram showing another example of the elastic sheet.

As in a cooling device 125 shown in FIG. 14 as an example, an elastic sheet 126 having a size that fits on the inner side with respect to the insertion hole 83 and the power receiving connector 75 may be used. Even in this case, the elastic sheet 126 is not provided in the portions of the attachment mechanism 26 and the power receiving connector 75.

Instead of attaching the elastic sheet 116 or 126, a protruding portion corresponding to the recess portion 111 may be formed on the back surface 82 of the heat sink 40. However, since it takes time and effort to process the back surface 82 in this method, the method of attaching the elastic sheet 116 or 126 is preferable.

Fourth Embodiment

Figure 15:
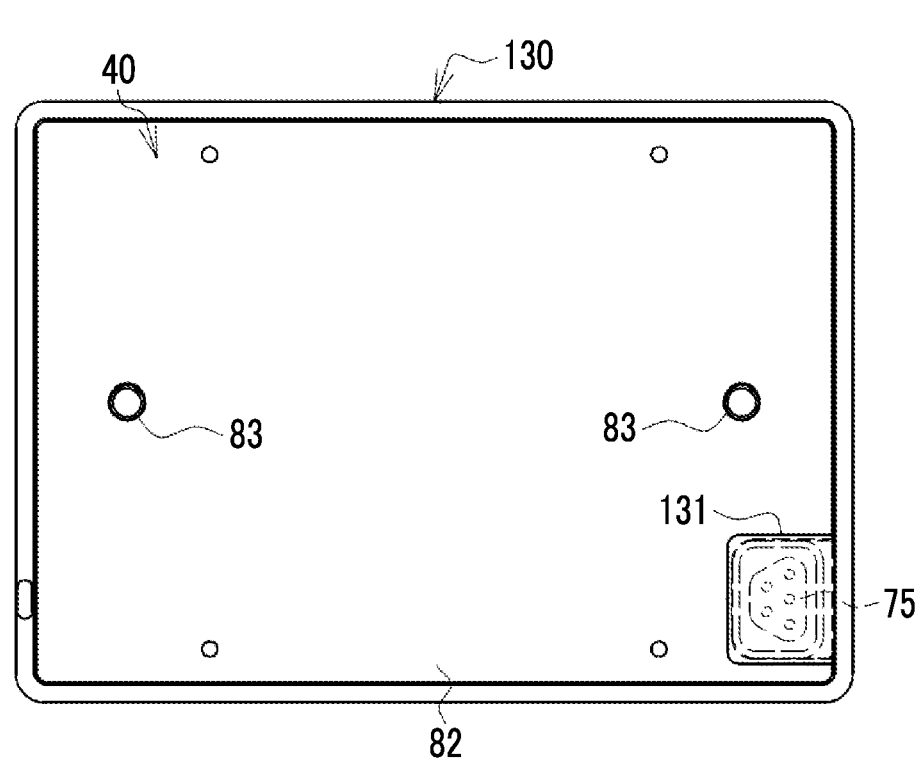
FIG. 15 is a diagram showing a cooling device according to a fourth embodiment which comprises a connector cover.
Figure 16:
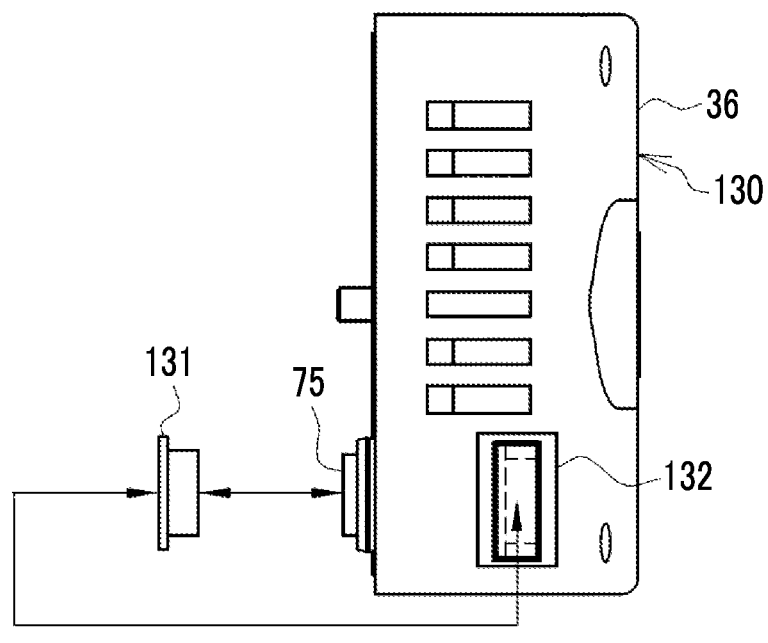
FIG. 16 is a diagram showing a positional relationship between the connector cover and an accommodation portion thereof.

As shown in FIGS. 15 and 16 as an example, a cooling device 130 according to a fourth embodiment comprises a connector cover 131 that is attachably and detachably attached to the power receiving connector 75. The connector cover 131 is put on the power receiving connector 75 to cover the power receiving connector 75 during non-use of the cooling device 130.

An accommodation portion 132 is provided between the power receiving connector 75 and the housing 36 at a portion of the housing 36 facing the power receiving connector 75. The accommodation portion 132 accommodates the connector cover 131 removed from the power receiving connector 75 during use of the cooling device 130. The accommodation portion 132 is provided with a holding mechanism (not shown) that holds the accommodated connector cover 131. The holding mechanism presses the connector cover 131 against a wall surface of the accommodation portion 132 by, for example, biasing of a spring. Alternatively, the holding mechanism is a shutter that opens and closes an opening of the accommodation portion 132. The holding mechanism may attract and hold the connector cover 131 by magnetic force. In a case in which the connector cover 131 is taken out from the accommodation portion 132, the holding by the holding mechanism is released by operating a button or the like.

As described above, the cooling device 130 according to the fourth embodiment comprises the connector cover 131 that covers the power receiving connector 75 during non-use, and the accommodation portion 132 that accommodates the connector cover 131 removed from the power receiving connector 75 during use. Since the chance of foreign matter such as dust entering the power receiving connector 75 during non-use is reduced by the connector cover 131, it is possible to reduce the risk of failure and contribute to the improvement of maintenance. In addition, the presence of the accommodation portion 132 secures a place for the connector cover 131 removed from the power receiving connector 75, so that it is possible to prevent the connector cover 131 from being lost.

The accommodation portion 132 is provided between the power receiving connector 75 and the housing 36. Therefore, it is easy to access in a case of putting the connector cover 131 on the power receiving connector 75 during non-use and in a case of accommodating the connector cover 131 removed from the power receiving connector 75 during use.

Fifth Embodiment

Figure 17:
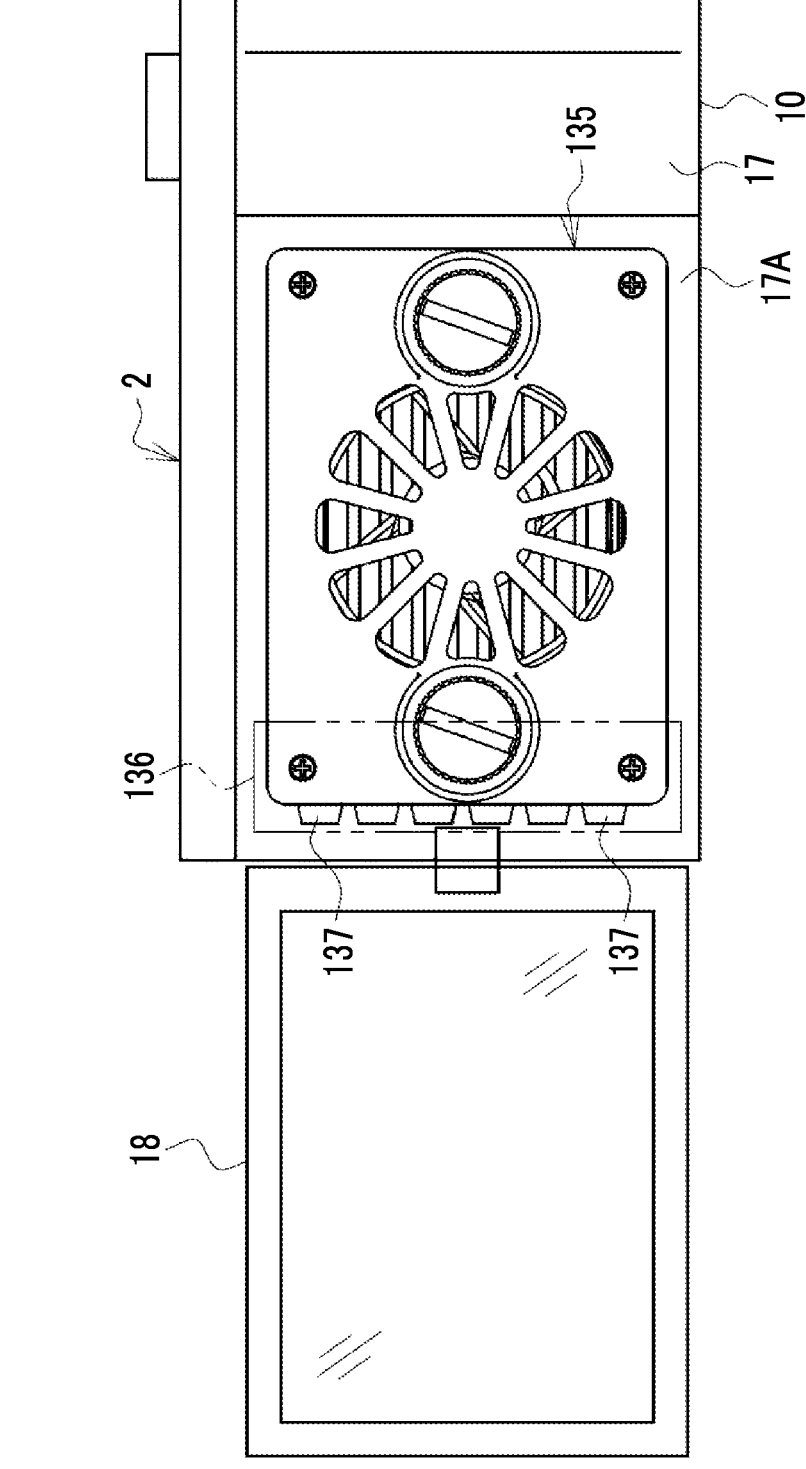
FIG. 17 is a diagram showing a cooling device according to a fifth embodiment in which a rubber cushion is attached to a side portion.

As shown in FIG. 17 as an example, in a cooling device 135, a plurality of trapezoidal columnar rubber cushions 137 are attached to a side portion 136. The side portion 136 is a part facing the mobile monitor 18 in a case in which the mobile monitor 18 is moved from a position facing the attached surface 17A. With the presence of the rubber cushion 137, even in a case in which the mobile monitor 18 is accidentally hit against the side portion 136, the mobile monitor 18 is not damaged. Therefore, the mobile monitor 18 can be protected.

Figure 18:
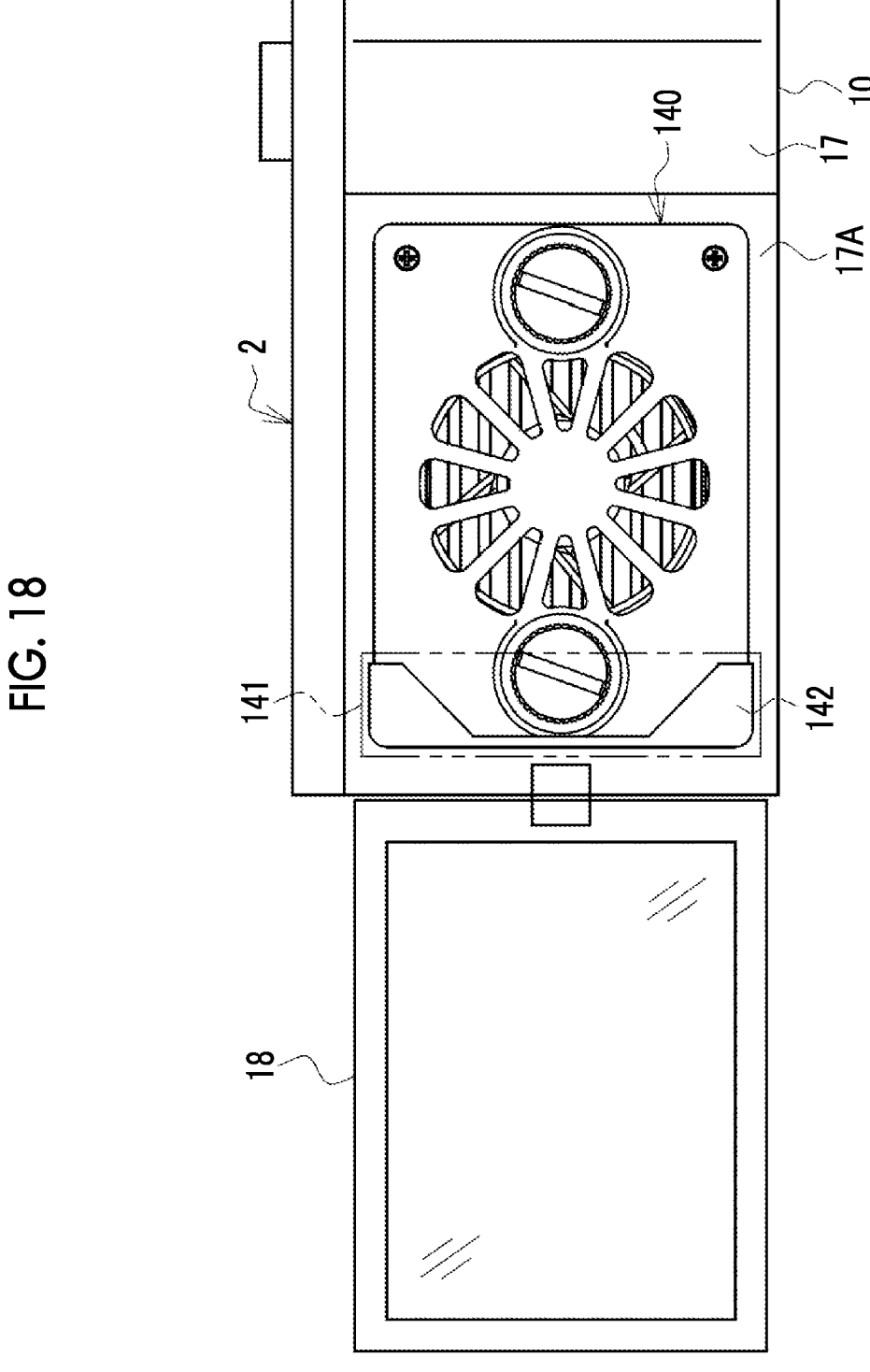
FIG. 18 is a diagram showing a cooling device according to a fifth embodiment in which a rubber cover is attached to a side portion.

As in a cooling device 140 shown in FIG. 18 as an example, a rubber cover 142 that covers a side portion 141 may be adopted instead of the rubber cushion 137. With the rubber cover 142, the amount of protrusion to the outside is reduced compared to the rubber cushion 137, so that the appearance can be improved.

Figure 19:
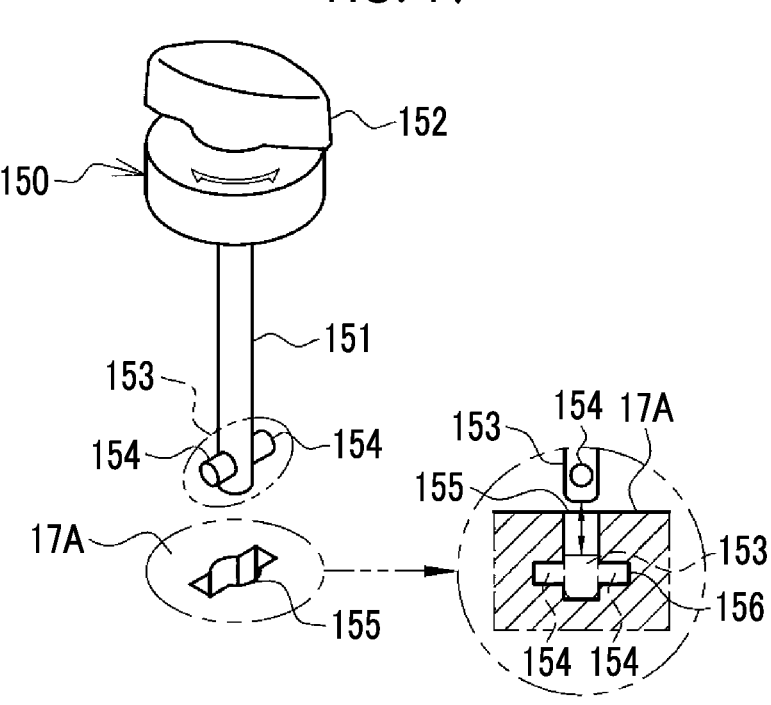
FIG. 19 is a diagram showing another example of an attachment mechanism.

In each of the above-described embodiments, the device attachment screw 35 is illustrated as the attachment mechanism 26, but the present invention is not limited thereto. A device attachment pin 150 shown in FIG. 19 as an example may be used. The device attachment pin 150 is a so-called rotary locking pin, and has a pin body portion 151 and a rotation knob 152 provided at one end of the pin body portion 151. The pin body portion 151 is made of metal, and the rotation knob 152 is made of a resin having high hardness and high heat resistance. The rotation knob 152 is rotationally operated by the user in a case of attaching and detaching the heat sink 40. A pair of columnar protrusions 154 is formed at positions facing each other on a tip portion 153 of the pin body portion 151. The protrusion 154 (pin body portion 151) rotates by 90° in conjunction with the rotation operation of the rotation knob 152. The pin body portion 151 is an example of an "insertion portion" according to the technology of the present disclosure. In addition, the rotation knob 152 is an example of an operation portion" according to the technology of the present disclosure.

On the other hand, a fitting hole 155 into which the tip portion 153 is fitted is formed in the attached surface 17A. The fitting hole 155 has a shape that follows a cross-sectional shape of the tip portion 153 including the protrusion 154. A circumferential groove 156 in which the protrusion 154 is accommodated is formed inside the fitting hole 155.

In a case in which the cooling device is attached to the attached surface 17A, the protrusion 154 is rotated by 90° by rotationally operating the rotation knob 152 after inserting the tip portion 153 of the pin body portion 151 into the fitting hole 155, thereby fitting the protrusion 154 into the groove 156. On the other hand, in a case in which the cooling device is removed from the attached surface 17A, the protrusion 154 is rotated by 90° in a reverse direction by rotationally operating the rotation knob 152 in a reverse direction, to release the fitting of the protrusion 154 to the groove 156, and then the pin body portion 151 is pulled up from the fitting hole 155.

Figure 20:
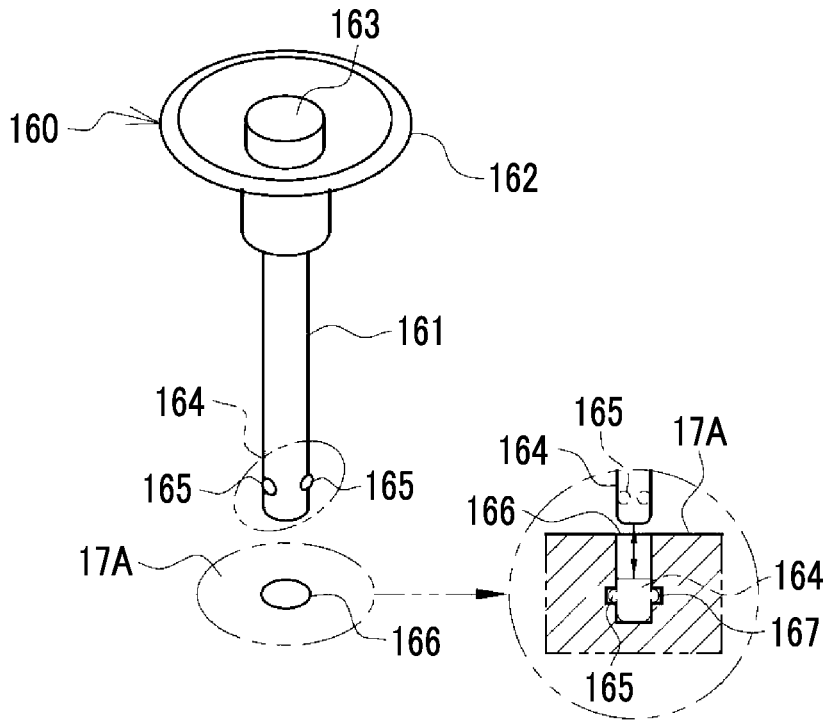
FIG. 20 is a diagram showing still another example of the attachment mechanism.

In addition, a device attachment pin 160 shown in FIG. 20 as an example may be used. The device attachment pin 160 is a so-called ball locking pin, and has a pin body portion 161 and a knob 162 provided at one end of the pin body portion 161. The knob 162 is provided with a button 163. The pin body portion 161 is made of metal, and the knob 162 is made of a resin having high hardness and high heat resistance. The button 163 is pressed by the user in a case of attaching and detaching the heat sink 40. Four balls 165 are attached to a tip portion 164 of the pin body portion 161 in a circumferential direction, for example, at intervals of 90°. The ball 165 can appear and disappear from the tip portion 164. The ball 165 protrudes from the tip portion 164 in a state where the button 163 is not pressed. The ball 165 sinks into the tip portion 164 in conjunction with the pressing of the button 163. The pin body portion 161 is an example of an "insertion portion" according to the technology of the present disclosure. In addition, the knob 162 including the button 163 is an example of an operation portion" according to the technology of the present disclosure.

On the other hand, a fitting hole 166 into which the tip portion 164 is fitted is formed in the attached surface 17A. The fitting hole 166 has a shape that follows a cross-sectional shape of the tip portion 164 into which the ball 165 sinks, that is, a circular shape. A circumferential groove 167 in which the ball 165 is accommodated is formed inside the fitting hole 166.

In a case in which the cooling device is attached to the attached surface 17A, the ball 165 is made to sink into the tip portion 164 by pressing the button 163. Then, the tip portion 164 is inserted into the fitting hole 166. After that, the pressing of the button 163 is released and the ball 165 is made to protrude from the tip portion 164, thereby fitting the ball 165 into the groove 167. On the other hand, in a case in which the cooling device is removed from the attached surface 17A, the ball 165 is made to sink into the tip portion 164 by pressing the button 163, to release the fitting of the ball 165 to the groove 167, and then the pin body portion 161 is pulled up from the fitting hole 166.

The number of the attachment mechanisms 26 is not limited to the two illustrated. For example, four attachment mechanisms 26 may be disposed at the four corners of the cooling device. The mobile monitor 18 is not limited to the vari-angle system illustrated in each of the above-described embodiments, and a tilt system may be used. In addition, the fan 38 may not be provided.

The processor is not limited to the CPU 13 illustrated. In addition to or instead of the CPU 13, a programmable logic device (PLD) which is a processor whose circuit configuration is changeable after manufacture, such as a field programmable gate array (FPGA), a dedicated electrical circuit which is a processor having a dedicated circuit configuration designed to execute specific processing, such as an application specific integrated circuit (ASIC), or the like may be used.

Although the digital camera 2 has been illustrated as the electronic apparatus, the present invention is not limited thereto. The technology of the present disclosure can be applied to any electronic apparatus that requires cooling in some cases.

In the technology of the present disclosure, the above-described various embodiments and/or various modification examples may be combined with each other as appropriate. In addition, the present disclosure is not limited to each of the above-described embodiments, and various configurations can be used without departing from the gist of the present disclosure.

The above descriptions and illustrations are detailed descriptions of portions related to the technology of the present disclosure and are merely examples of the technology of the present disclosure. For example, description related to the above configurations, functions, actions, and effects is description related to an example of configurations, functions, actions, and effects of the parts according to the embodiment of the disclosed technology. Therefore, unnecessary portions may be deleted or new elements may be added or replaced in the above descriptions and illustrations without departing from the gist of the technology of the present disclosure. Further, in order to avoid complications and facilitate understanding of the parts related to the technology of the present disclosure, descriptions of common general knowledge and the like that do not require special descriptions for enabling the implementation of the technology of the present disclosure are omitted, in the contents described and shown above.

In the present specification, the term "A and/or B" is synonymous with the term "at least one of A or B". That is, the term "A and/or B" means only A, only B, or a combination of A and B. In addition, in the present specification, the same approach as "A and/or B" is applied to a case in which three or more matters are represented by connecting the matters with "and/or".

All documents, patent applications, and technical standards mentioned in the present specification are incorporated herein by reference to the same extent as in a case in which each document, each patent application, and each technical standard are specifically and individually described by being incorporated by reference.

What is claimed is:

1. A cooling device comprising:
a heat sink on which a plurality of fins for heat radiation are formed;
an attachment mechanism for attachably and detachably attaching the heat sink to an outer surface of an electronic apparatus, at least a part of the attachment mechanism overlapping a formation region of the fins;
a housing that covers the heat sink; and
a falling-off prevention member that prevents the attachment mechanism from falling off from the housing,
wherein the attachment mechanism includes
an insertion hole provided in the formation region,
an insertion portion to be inserted into the insertion hole, and
an operation portion that is provided at one end of the insertion portion and is operated by a user in a case of attaching and detaching the heat sink,
wherein the insertion hole is provided between two fins adjacent to each other,
the insertion portion is disposed inside the housing, and the operation portion is disposed outside the housing, and
the falling-off prevention member is provided at a boundary portion between the insertion portion and the operation portion.

2. The cooling device according to claim 1,
wherein the insertion hole penetrates the fin.

3. The cooling device according to claim 1,
wherein the fins include a first fin and a second fin having a height lower than a height of the first fin,
the second fin is at least any of a fin adjacent to the insertion hole or a fin overlapping the insertion hole, and
the falling-off prevention member is provided between the housing and the second fin.

4. The cooling device according to claim 1, further comprising:
a fan that sends cooling air to the heat sink,
wherein a plurality of the attachment mechanisms are provided, and
the plurality of attachment mechanisms are provided at positions where the fan is interposed therebetween.

5. The cooling device according to claim 1, further comprising:
a fan that sends cooling air to the heat sink and is attached to the formation region,
wherein the fins include a first fin and a third fin having a height lower than a height of the first fin, and
the third fin overlaps the fan in a plan view.

6. A cooling device comprising:
a heat sink on which a plurality of fins for heat radiation are formed;
an attachment mechanism for attachably and detachably attaching the heat sink to an outer surface of an electronic apparatus, at least a part of the attachment mechanism overlapping a formation region of the fins;
an elastic sheet that is provided on an attachment surface of the heat sink to the outer surface and is used for adhering the heat sink to the outer surface;
a fan that sends cooling air to the heat sink; and
a power receiving connector that is provided on the attachment surface of the heat sink to the outer surface and receives drive power of the fan from the electronic apparatus,
wherein the attachment mechanism includes an insertion hole provided in the formation region,
the insertion hole is provided between two fins adjacent to each other, and
the elastic sheet is not provided in a portion of the power receiving connector.

7. The cooling device according to claim 6,
wherein the elastic sheet is not provided in a portion of the attachment mechanism.

8. A cooling device comprising:
a heat sink on which a plurality of fins for heat radiation are formed;
an attachment mechanism for attachably and detachably attaching the heat sink to an outer surface of an electronic apparatus, at least a part of the attachment mechanism overlapping a formation region of the fins;
a fan that sends cooling air to the heat sink;
a power receiving connector that receives drive power of the fan from the electronic apparatus;
a connector cover that covers the power receiving connector during non-use of the cooling device; and
an accommodation portion having a space that accommodates the connector cover removed from the power receiving connector during use of the cooling device,
wherein the attachment mechanism includes an insertion hole provided in the formation region, and
the insertion hole is provided between two fins adjacent to each other.

9. The cooling device according to claim 8, further comprising:
a housing that covers the heat sink,
wherein the accommodation portion is provided between the power receiving connector and the housing.

10. An electronic apparatus system comprising:
an electronic apparatus; and
the cooling device according to claim 1.

11. The electronic apparatus system according to claim 10,
wherein the electronic apparatus is an imaging apparatus comprising a mobile monitor that is movable to at least a first position and a second position, and
the outer surface is a surface that faces the mobile monitor in a case in which the mobile monitor is at the first position and is exposed in a case in which the mobile monitor is at the second position.

* * * * *